United States Patent
Gravrand et al.

(10) Patent No.: US 7,041,978 B2
(45) Date of Patent: May 9, 2006

(54) PHOTOVOLTAIC INFRARED RADIATION DETECTOR WITH INDEPENDENT THREE-DIMENSIONAL CONDUCTING GRID

(75) Inventors: Olivier Gravrand, Grenoble (FR); Jacques Baylet, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/845,172

(22) Filed: May 14, 2004

(65) Prior Publication Data

US 2004/0238743 A1     Dec. 2, 2004

(30) Foreign Application Priority Data

May 26, 2003   (FR) .................................. 03 06324

(51) Int. Cl.
   *G01J 5/20*    (2006.01)

(52) U.S. Cl. ................................. 250/338.4; 250/336.1
(58) Field of Classification Search ............. 250/338.4
See application file for complete search history.

(56) References Cited

U.S. PATENT DOCUMENTS

| | | | |
|---|---|---|---|
| 5,185,648 A * | 2/1993 | Baker et al. ................. 257/189 |
| 5,952,703 A | 9/1999 | Murakami et al. | |
| 2002/0005485 A1* | 1/2002 | Hashimoto et al. ...... 250/338.1 |
| 2002/0033453 A1* | 3/2002 | Sauer et al. ............. 250/338.1 |

FOREIGN PATENT DOCUMENTS

| | | |
|---|---|---|
| EP | 0 428 159 A1 | 5/1991 |
| EP | 0 601 200 A1 | 6/1994 |
| EP | 0 747 962 A2 | 12/1996 |
| EP | 0 797 255 A2 | 9/1997 |
| EP | 1 028 470 A2 | 8/2000 |
| EP | 1 265 296 A1 | 12/2002 |

* cited by examiner

*Primary Examiner*—David Porta
*Assistant Examiner*—Marcus Taningco
(74) *Attorney, Agent, or Firm*—Oliff & Berridge, PLC

(57) ABSTRACT

On a front face of a substrate transparent to the radiation considered, pixels are confined in a stack of absorbent semi-conducting material layers by a network of channels. An insulating layer covers the bottom and the side walls of the channels. An electrically conducting layer covers the insulating layer on the bottom and on the side walls of the channels confining at least a part of the pixels. The conducting layer can be voltage polarized.

12 Claims, 2 Drawing Sheets

PHOTOVOLTAIC INFRARED RADIATION DETECTOR WITH INDEPENDENT THREE-DIMENSIONAL CONDUCTING GRID

BACKGROUND OF THE INVENTION

The invention relates to a photovoltaic infrared radiation detector comprising, on a front face of a substrate transparent to the radiation considered, a stack of layers made of absorbent semi-conducting materials, a network of channels confining pixels in the stack of layers, and an insulating layer covering at least the bottom and side walls of the channels.

STATE OF THE ART

A semi-conductor-based multi-spectral photovoltaic infrared radiation detector is typically formed by a detection circuit and a read circuit:

The detection circuit is made from a semi-conducting material absorbing radiation in one or more infrared bands of distinct cutoff wavelengths, and comprises photodiodes collecting the current from the photo-carriers generated.

The read circuit performs multiplexing of the detection circuit photodiodes or interconnection of the detection circuit with an external circuit.

The present invention concerns the detection circuit of such a detector.

Several types of multi-spectral detection can be differentiated, in particular temporal coherence detection, spatial coherence detection or spatio-temporal coherence detection:

Temporal coherence detection is achieved when acquisition of the different spectral bands is performed simultaneously. This requires at least one electrical connection per spectral band.

Spatial coherence detection is achieved by a network of separate pixels each comprising several sensitive semi-conducting zones corresponding to the different spectral bands, superposed and centered with respect to one another. Each sensitive zone has associated thereto a photodiode which is typically formed by a PN junction. Spatial coherence is achieved when the collection volumes of the different junctions are centered with respect to one another. Each junction must be electrically separated from the adjacent pixel junctions.

Spatio-temporal coherence detection is achieved by combination of the two previous cases and imposes the previous constraints on a single circuit.

Detectors are generally in matrix form (of one or more columns), and the elementary dots are called pixels. These pixels are zones defined at the surface of the detector that are dedicated either to detection (pixel called "active") or to other functions (pixel called "inactive") such as substrate contact resumption. Generally the pixels are physically separated from one another by inter-pixel separating zones created by etching of channels in the material between adjacent pixels, followed by deposition of an insulator on the surface of the material. Etching of the channels gives rise to several problems:

The channels between adjacent pixels being in general of non-negligible width with respect to the width of the pixels, this results in a loss of useful surface and of quantum efficiency of the detector.

Possible photon leakage via the side walls or the bottom of the channels and reflections to the outside of the detector may introduce extra-pixel crosstalk (detection of a photon intended for a pixel by an adjacent pixel) or intra-pixel crosstalk (detection of a photon intended for a spectral band in a sensitive zone corresponding to another spectral band).

The etching process generally downgrades the electrical properties of the absorbent material near to the side walls of the channels.

OBJECT OF THE INVENTION

One object of the invention is to remedy these shortcomings and in particular to optimize the quantum efficiency and to minimize the crosstalk of a semi-conductor-based photovoltaic infrared radiation detector.

According to the invention, this object is achieved by the fact that the detector comprises an electrically conducting layer covering the insulating layer on the bottom and on the side walls of the channels and electrically independent from the semi-conducting materials.

According to a development of the invention, the electrically conducting layer is voltage polarized.

Another object of the invention is a process for achieving a photovoltaic infrared radiation detector according to the invention, comprising deposition on a front face of a substrate, transparent to the radiation considered, of a stack of layers made of absorbent semi-conducting materials, confinement of a network of pixels by etching channels in the stack of semi-conducting material layers, deposition of an insulating layer covering at least the bottom and the side walls of the channels, and deposition of an electrically conducting layer covering the insulating layer on the bottom and the side walls of the channels confining at least a part of the pixels.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
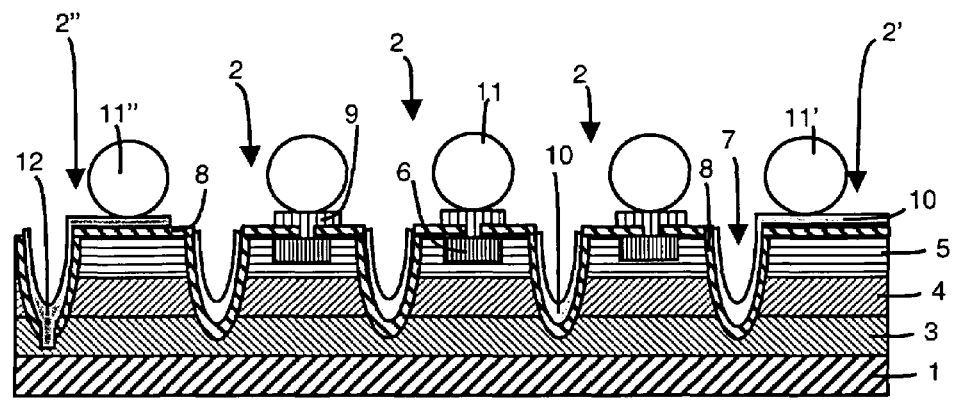
FIGS. 1 and 2 represents a particular embodiment of a detector according to the invention, respectively in cross-section along the axis AA and in top view.
Figure 2:
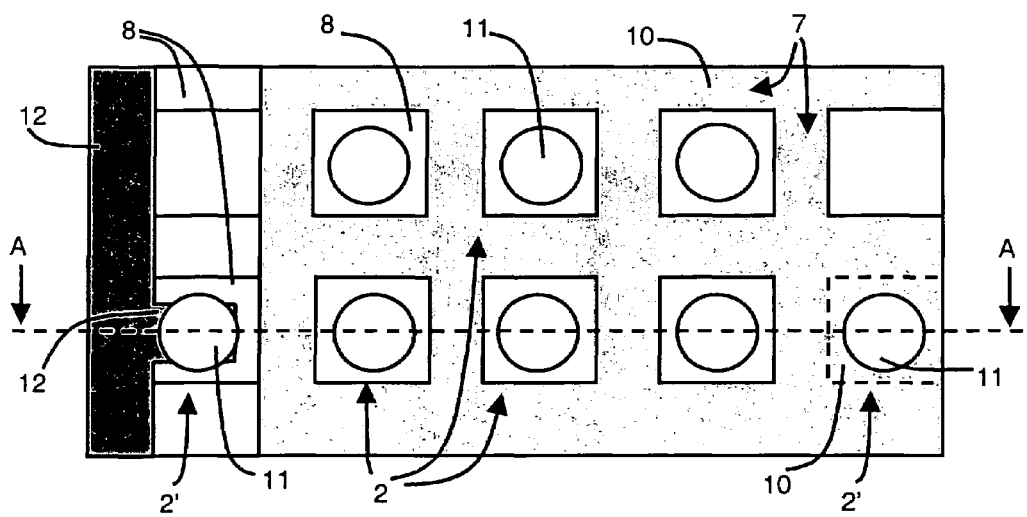

FIGS. 1 and 2 represent a photovoltaic infrared radiation detector enabling spatial coherence detection to be achieved. A network of active pixels 2 and inactive pixels (2', 2") is arranged on a front face of a substrate 1 transparent to the radiation considered. Each pixel is confined in a stack of layers 3–6 made of absorbent semi-conducting materials, and is separated from the adjacent pixels by substantially concave channels 7 made in the stack of layers 3–6 so as to form a network of communicating channels 7 perpendicular to one another (FIG. 2). The bottoms and side walls of the channels are covered with an insulating layer 8 that also covers the front face of the inactive pixels 2' and 2" arranged at the ends of the detector (to the left and to the right in FIGS. 1 and 2).

The front faces of the active pixels 2 are partially covered by the insulating layer 8 over a first peripheral zone of the front face leaving in the center of each active pixel 2 a second central zone that is covered with a metal layer 9 overlapping the insulating layer 8 at the periphery of the central zone and enabling the electric signal delivered by the pixel to be recovered.

An electrically conducting layer 10 covers the insulating layer 8 on the bottom and side walls of the channels 7 of most of the channel network and on the front face of an inactive pixel 2', situated on the right in FIGS. 1 and 2. The electrically conducting layer 10 thus forms a three-dimensional conducting grid independent from the semi-conducting materials. On the pixels there are arranged connection terminals 11 and 11' respectively in contact with the metallic layers 9 arranged on the active pixels 2 and with the conducting layer 10 in contact with the inactive pixel 2' situated on the right in FIGS. 1 and 2. The terminal 11 enables the active pixel to be electrically controlled and terminal 11' enables the electrically conducting layer 10 to be voltage polarized. The terminals 11 and 11' are advantageously identical.

The inactive pixel 2" is independent from the rest of the structure; it enables the contact of the internal layers to be resumed. A channel situated at one end of the detector (to the left in FIGS. 1 and 2) comprises an electrical connection layer 12 enabling the rear layer 3 of the stack of semi-conducting material layers 3–6 to be polarized. The electrical connection layer 12 fills a hole passing through the insulating layer 8 at the bottom of the end channel adjacent to an inactive pixel 2' and covers the insulating layer 8 on the side walls of the channel and partly on the front face of the inactive pixel 2'. The rear layer 3 can thus be polarized by means of an associated connection terminal 11. The electrical connection layer 12 is not in electrical contact with the electrically conducting layer 10.

The pixels represented in FIG. 1 enable bi-spectral detection, i.e. detection of two different spectral bands. The absorbent layers 3 and 4 have a common cutoff wavelength lower than the cutoff wavelengths of the layers 5 and 6. At the interface of layers 3 and 4 on the one hand and at the interface of layers 5 and 6 on the other hand, PN junctions are created by opposite doping of the respective layers. To obtain a multi-spectral detector, a plurality of PN junctions can be stacked on the front face of the substrate 1 in increasing cutoff wavelength order of the materials constituting the PN junctions. The stack of semi-conductor material layers can thus be a multiple stack alternating N-doped layers (layers 3 and 6 for example) and P-doped layers (layers 4 and 5 for example), for example of NPPNNP type. In the particular embodiment represented, the layer 6 associated to an active pixel 2 is formed by doping of the central part of the corresponding layer 5.

Reading of the bi-spectral detector represented in FIG. 1 is performed by applying suitable electrical voltages between the rear layer 3 of the stack by means of the electrical connection layer 12, and the terminals 11 of the active pixels 2.

Figure 3:
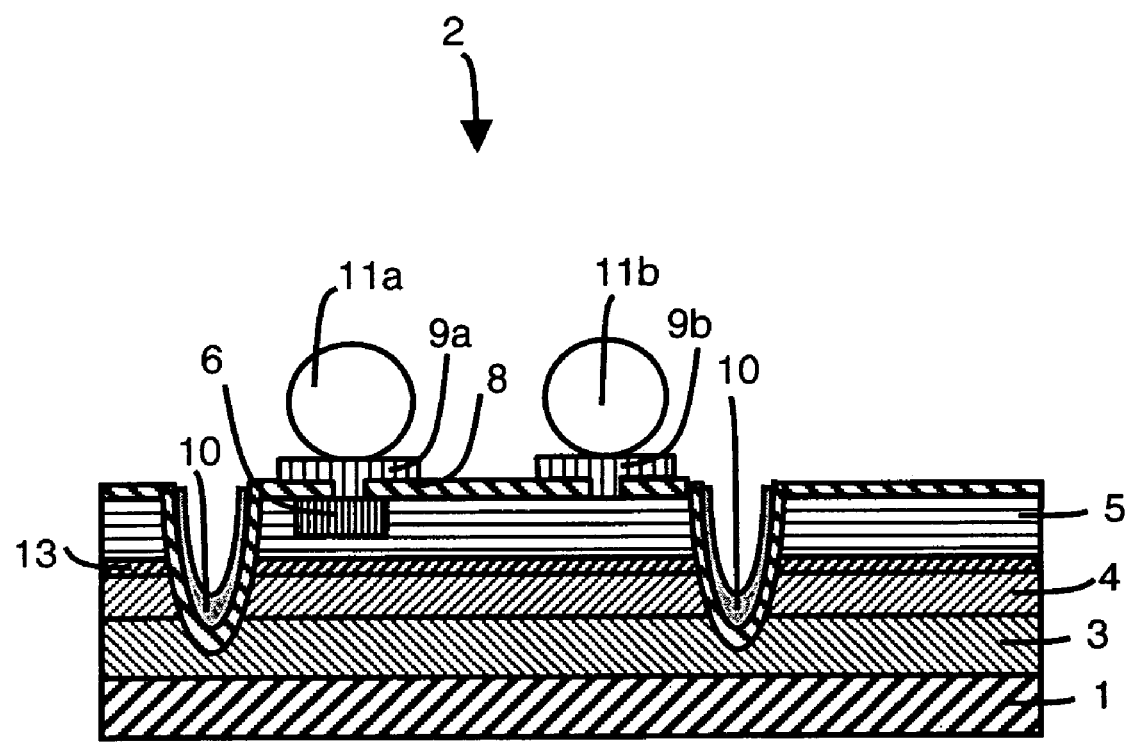
FIG. 3 represents a particular embodiment of a pixel of a detector according to the invention.

Another particular embodiment of an active pixel 2, represented in FIG. 3, enables two spectral bands to be distinguished simultaneously by means of two connection terminals 11a and 11b associated to the same pixel, and thereby enables spatio-temporal coherence detection to be performed. A first terminal 11a is in electrical contact with the layer 6 and a second terminal 11b is in electrical contact with the layer 5, respectively by means of a metallic layer 9a covering a second zone in contact with the layer 6 and a metallic layer 9b covering a third zone in contact with the layer 5 of the active pixel 2. The first terminal 11a enables the PN junction corresponding to the layers 5 and 6 to be polarized whereas the second terminal 11b enables the PN junction corresponding to the layers 3 and 4 to be polarized.

The electrically conducting layer 10 presents several advantages:

Photons propagating in the direction of the space between two adjacent pixels are concentrated on the center of a pixel, which enables the efficiency of the detector to be increased. The layer acts as waveguide. Its efficiency depends on the geometry of the channels which must also be suited to the geometry of the sensitive zones of the pixel.

As the passage of non-absorbed photons in the space between the pixels is limited, extra-pixel and intra-pixel crosstalk problems are reduced.

Polarization of the conducting layer 10 enables the configuration of the electric field inside a pixel and the band structure near the side walls of a pixel to be modified. The photo-carriers can thus be repelled in the direction of the junctions, which enables the efficiency of the detector to be increased. An optimum voltage can be chosen according to the geometry of the pixels and of the junctions and according to other voltages applied to the detector.

A process for achieving a bi-spectral photovoltaic infrared radiation detector according to FIGS. 1 and 2 comprises deposition of the stack of absorbent semi-conducting material layers 3–6 on the front face of the substrate 1. The materials of the layers can preferably be of the $Cd_xHg_{1-x}Te$ type and be deposited by molecular beam epitaxy, a process which enables the evolution of the composition of a layer according to the thickness of the epitaxy to be closely monitored. A first layer 3 of N-doped $Cd_{0.4}Hg_{0.6}Te$ and a second layer 4 of P-doped $Cd_{0.4}Hg_{0.6}Te$ can form a first PN junction. As both the materials have a cutoff wavelength of 3 μm, the layers 3 and 4 enable a first spectral band to be detected. On the front face of the layer 4 there is deposited a layer 5 of P-doped $Cd_{0.3}Hg_{0.7}Te$ enabling a second spectral band having a cutoff wavelength of 5 μm to be absorbed. In this layer 5 a PN junction is achieved by an ion implantation step so as to create an N-doped layer 6 inside the layer 5.

The invention can apply to other detectors. For example, II–VI compound-based detectors (like CdHgTe) can be of interest: CdZnTe, ZbSe, etc . . . III–V compound-based detectors are also concerned; they can be chosen from GaAs, InSb, InAsSb, InGaAs, etc . . . Finally lead salts can also be suitable.

The stack of layers 3–6 obtained by the deposition and implantation steps covers the whole surface of the substrate 1 uniformly. Etching of channels 7 in the stack enables the network of active pixels 2 and inactive pixels 2' to be confined. An insulating layer 8 is then deposited on most of the surface of the detector, in particular on the front face of the pixels, the bottoms and side walls of the channels 7, except on a central zone of the front face of the pixels where a metallic layer 9, 9a or 9b is deposited in contact with the layer 6 or with the layer 5 (FIG. 3) to connect the pixels to the connection terminals 11. Each pixel obtained is formed by two photodiodes in opposition (NPPN) whose operation is controlled by the voltage applied between the rear layer 3 and the connection terminals 11. The pitch of the pixel network can be about 30 μm.

A metallic deposit then enables the electrically conducting layer 10 to be obtained, covering the insulating layer 8 at the bottom and on the side walls of the channels of a part of the network without being in contact with the conducting parts (9a, 9b, 12) themselves in contact with the semi-conducting layers. This electrically conducting layer 10 can itself be a stack of layers (not shown) in order to enhance its adherence, its conductivity, its optical properties, etc . . . it can be made from materials such as Au, Ti, Al, Pd, Pt, etc.

The stack of semi-conducting material layers can comprise, between two PN junctions, an additional semi-conducting layer 13 (FIG. 3) presenting a semi-conducting gap larger than the gaps of said semi-conducting materials and thus acting as electrical barrier for the photo-carriers, which enables intra-pixel crosstalk to be further limited.

It is noteworthy that the thickness of the layers having the smallest cutoff wavelength must be sufficient to absorb a maximum of photons of smaller wavelength in order to limit direct crosstalk, i.e. detection of the photons in a higher layer without reflection on the etching walls or on an element external to the detection circuit.

The invention claimed is:

1. Photovoltaic infrared radiation detector comprising, on a front face of a substrate transparent to the radiation considered, a stack of layers made of absorbent semi-conducting materials, a network of channels confining pixels in the stack of layers, and an insulating layer covering at least the bottom and side walls of the channels, detector comprising an electrically conducting layer covering the insulating layer on the bottom and on the side walls of the channels and electrically independent from the semi-conducting materials of the stack of layers made of absorbent semi-conducting material so as to be totally electrically insulated from the semi-conducting materials of the stack of layers made of absorbent semi-conducting materials by said insulating layer.

2. Detector according to claim 1, wherein the electrically conducting layer is connected to a connection terminal.

3. Detector according to claim 1, wherein the insulating layer also covers, at least partially, the front face of at least one pixel.

4. Detector according to claim 3, wherein the electrically conducting layer covers at least a part of the insulating layer covering, at least partially, the front face of a pixel.

5. Detector according to claim 4, wherein a connection terminal is situated on the electrically conducting layer, on the front face of a pixel.

6. Detector according to claim 1, wherein the stack of absorbent semi-conducting material layers forms at least two PN junctions having different cutoff wavelengths stacked on the front face of the substrate in increasing cutoff wavelength order.

7. Detector according to claim 1, wherein the semi-conducting materials are chosen from CdHgTe, InSb, InGaAs.

8. Detector according to claim 1, wherein the electrically conducting layer comprises a stack of several layers.

9. Detector according to claim 1, wherein the electrically conducting layer comprises at least one material chosen from Au, Ti, Al, Pt, Pd.

10. Process for achieving a photovoltaic infrared radiation detector according to claim 1, comprising deposition on a front face of a substrate, transparent to the radiation considered, of a stack of layers made of absorbent semi-conducting materials, confinement of a network of pixels by etching channels in the stack of semi-conducting material layers, deposition of an insulating layer covering at least the bottom and the side walls of the channels, and deposition of an electrically conducting layer covering the insulating layer on the bottom and the side walls of the channels confining at least a part of the pixels.

11. Photovoltaic infrared radiation detector comprising, on a front face of a substrate transparent to the radiation considered, a stack of layers made of absorbent semi-conducting materials, a network of channels confining pixels in the stack of layers, and an insulating layer covering at least the bottom and side walls of the channels, detector comprising an electrically conducting layer covering the insulating layer on the bottom and on the side walls of the channels and electrically independent from the semi-conducting materials of the stack of layers made of absorbent semi-conducting material so as to be totally electrically insulated from the semi-conducting materials of the stack of layers made of absorbent semi-conducting materials by said insulating layer, wherein the stack of semi-conducting material layers comprises, between two PN junctions, an additional semi-conducting layer presenting a larger semi-conducting gap than the gaps of said semi-conducting materials.

12. Process for using a photovoltaic infrared radiation detector comprising:

providing an infrared radiation detector comprising, on a front face of a substrate transparent to the radiation considered, a stack of layers made of absorbent semi-conducting materials, a network of channels confirming pixels in the stack of layers, and an insulating layer covering at least the bottom and side walls of the channels, said detector comprising an electrically conducting layer covering the insulating layer on the bottom and on the side walls of the channels and electrically independent from the semi-conducting materials so as to be totally electrically insulated from the semi-conducting materials by said insulating layer; and voltage polarizing the electrically conducting layer.

* * * * *